(12) United States Patent
Karp (10) Patent No.: US 9,275,180 B1
(45) Date of Patent: Mar. 1, 2016

(54) PROGRAMMABLE INTEGRATED CIRCUIT HAVING DIFFERENT TYPES OF CONFIGURATION MEMORY

(71) Applicant: Xilinx, Inc., San Jose, CA (US)

(72) Inventor: James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/330,922

(22) Filed: Jul. 14, 2014

(51) Int. Cl.
*G06F 17/50* (2006.01)
*H03K 19/0175* (2006.01)

(52) U.S. Cl.
CPC .... *G06F 17/5054* (2013.01); *H03K 19/017581* (2013.01)

(58) Field of Classification Search
CPC ................. H01L 2924/00; H01L 2924/00015; H01L 2924/0002; H01L 2924/00012; H01L 27/2463; H01L 2924/00014; H01L 2924/13091; G06F 15/00; G06F 17/17; G06F 17/5068; G06F 11/106; G06F 11/1068; G06F 11/2094; G06F 17/505; G06F 17/5054; G06F 11/142; G06F 11/2017; G06F 15/17381; G06F 17/5045; G11C 16/10; H04L 45/44; H04L 49/10; H04L 49/15
USPC .................................................. 716/111–138
See application file for complete search history.

(56) References Cited

U.S. PATENT DOCUMENTS

| | | | |
|---|---|---|---|
| 6,621,325 B2 | 9/2003 | Hart et al. | |
| 6,777,978 B2 | 8/2004 | Hart et al. | |
| 7,089,527 B2 | 8/2006 | Hart et al. | |
| 7,249,010 B1 * | 7/2007 | Sundararajan et al. | 703/21 |
| 8,065,644 B1 | 11/2011 | Jacobson et al. | |
| 8,504,974 B1 * | 8/2013 | Trimberger | 716/136 |
| 2014/0104946 A1 | 4/2014 | Lee et al. | |
| 2014/0145293 A1 * | 5/2014 | Jain et al. | 257/499 |

OTHER PUBLICATIONS

B. Pratt, et. al., "Fine-Grain SEU Mitigation for FPGAs Using Partial TMR", IEEE Trans. on Nuclear Science, vol. 55, No. 4, Aug. 2008, pp. 2274-2280.*
B. Bridgford, et. al, "Single-Event Upset Mitigation Selection Guide", XAPP987, Mar. 2008.*
B. Pratt, et. al., "Improving FPGA Design Robustness with Partial TMR", IEEE 44th Annual International Reliability Physics Symposium, 2006, pp. 226-232.*

(Continued)

*Primary Examiner* — Alexander H Taningco
*Assistant Examiner* — Seokjin Kim
(74) *Attorney, Agent, or Firm* — LeRoy D. Maunu (57) ABSTRACT

To implement a circuit design on a programmable integrated circuit (IC), first data are generated for implementing the circuit design. Critical and non-critical portions of the circuit design are determined, and second data are generated for programming configuration memory cells of the programmable IC to implement the circuit design. A first subset of the second data is assigned to program a first type of configuration memory cells to implement the critical portion of the circuit design on a first subset of programmable logic resources and a first subset of programmable interconnect resources of the programmable IC. A second subset of the second data is assigned to program a second type of configuration memory cells to implement the non-critical portion of the circuit design on a second subset of programmable logic resources and a second subset of programmable interconnect resources. The second data are stored in an electronically readable storage medium.

15 Claims, 5 Drawing Sheets

(56) References Cited

OTHER PUBLICATIONS

Vikram Chandrasekhar, et al. "Reduced Triple Modular Redundancy for Tolerating SEUs in SRAM-based FPGAs." Proceedings of NASA International Conference on Military Applications in Programmable Logic Devices (MAPLD). 2005.*

Specification and drawings for U.S. Appl. No. 14/266,547, filed Apr. 30, 2014, Jain et al.

Pratt, Brian et al., "Improving FPGA Design Robustness with Partial TMR," 44th *Annual IEEE International Reliability Physics Symposium Proceedings*, Mar. 26, 2006, pp. 226-232, IEEE, Piscataway, New Jersey, USA.

Pratt, Brian et al., "Fine-Grain SEU Mitigation for FPGAs Using Partial TMR," *IEEE Transactions on Nuclear Science*, Aug. 2008, pp. 2274-2280, IEEE, Piscataway, New Jersey, USA.

Guo, Jing et al., "Novel Low-Power and Highly Reliable Radiation Hardened Memory Cell for 65 nm CMOS Technology," IEEE Transactions on Circuits and Systems—I: Regular Papers, Jul. 2014, pp. 1994-2001, vol. 61, No. 7, IEEE, Piscataway, New Jersey, USA.

Rennie, David J. et al., "Design Challenges in Nanometric Embedded Memories," Proc. of the 2009 3rd International Conference on Signals, Circuits and Systems, Nov. 6, 2009, pp. 1-8, IEEE, Piscataway, New Jersey, USA.

* cited by examiner

PROGRAMMABLE INTEGRATED CIRCUIT HAVING DIFFERENT TYPES OF CONFIGURATION MEMORY

TECHNICAL FIELD

The disclosure generally relates to the configuration memory of programmable integrated circuits.

BACKGROUND

Traditional programmable integrated circuits (ICs) such as Complex PLDs (CPLDs) and Field Programmable Gate Arrays (FPGAs) typically use millions of Static Random Access Memory (SRAM) configuration memory cells to program the functionality of the implemented circuit. The configuration memory cells may be those for programming interconnect, logic, or memory resources of the programmable IC, for example.

The presence of an increasing number of SRAM configuration memory cells in programmable ICs, with chip geometries becoming smaller and supply voltages becoming lower, increases the likelihood that the configuration memory cell storage state could be upset due to collisions with cosmic particles from outer space or alpha particles from IC packaging materials. The unexpected change in state of a memory cell is referred to as a single event upset (SEU). With SEUs more likely to occur, the mean time to failure for a particular program configuration for the PLD will decrease and the failures in time (FIT) rate will increase.

SUMMARY

According to one method of generating an implementation of a circuit design on a programmable integrated circuit, first data are generated for implementing an input circuit design. The method determines a critical portion and a non-critical portion of the circuit design. Second data are generated for programming configuration memory cells of the programmable IC to implement the circuit design. A first subset of the second data is assigned to program 6T configuration memory cells of the programmable IC to implement three or more instances of the critical portion of the circuit design on a first subset of programmable logic resources and a first subset of programmable interconnect resources of the programmable IC. A second subset of the second data is assigned to program 12T configuration memory cells of the programmable IC to implement a voting circuit on a second subset of programmable logic resources and a second subset of programmable interconnect resources of the programmable IC. The voting circuit is coupled to receive output signals from the three instances of the first portion of the circuit design. The second data are stored in an electronically readable storage medium.

According to another method of generating an implementation of a circuit design on a programmable IC, a circuit design is input and first data are generated for implementing the circuit design. Critical and non-critical portions of the circuit design are determined. The second method generates second data for programming configuration memory cells of the programmable IC to implement the circuit design. A first subset of the second data is assigned to program a first type of configuration memory cells to implement the critical portion of the circuit design on a first subset of programmable logic resources and a first subset of programmable interconnect resources of the programmable IC. A second subset of the second data is assigned to program a second type of configuration memory cells to implement the non-critical portion of the circuit design on a second subset of programmable logic resources and a second subset of programmable interconnect resources of the programmable IC. The second data are stored in an electronically readable storage medium.

A programmable IC includes a configuration memory having a first plurality of 6T memory cells and a second plurality of 12T memory cells. Programmable interconnect resources are coupled to the configuration memory. A first subset of the programmable interconnect resources are programmable by a subset of the 6T memory cells, and a second subset of the programmable interconnect resources are programmable by a subset of the 12T memory cells. Programmable logic resources are coupled to the configuration memory. A first subset of the programmable logic resources are programmable by a subset of the 6T memory cells, and a second subset of the programmable logic resources are programmable by a subset of the 12T memory cells. Programmable input/output (I/O) resources are coupled to the configuration memory.

Other features will be recognized from consideration of the Detailed Description and Claims, which follow.

BRIEF DESCRIPTION OF THE DRAWINGS

Various aspects and features of the disclosed methods and systems will become apparent upon review of the following detailed description and upon reference to the drawings, in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and circuits involve a programmable IC in which some, but not all, of the configuration memory cells are 12T (12-transistor) SRAM cells, and the other configuration memory cells are 6T (6-transistor) SRAM cells. By implementing the programmable IC having only some of the configuration memory cells implemented with 12T SRAM, not all of the interconnect and logic resources of critical parts of a design need to be made triple modular redundant (TMR) to reduce the SEU FIT rate. Critical parts of the circuit design can be placed and routed on resources that are configured by the 12T cells, and non-critical parts of the circuit design can be placed and routed on resources that are configured by the 6T cells. Alternatively, a critical part of the circuit design may be made TMR using the 6T configuration memory cells, and a voting circuit can be implemented using the 12T configuration memory cells to make the voting circuit resilient to SEUs. Because not all of the configuration memory cells are implemented with 12T SRAM, the footprint of the programmable IC is not significantly larger than the footprint of a programmable IC having all configuration memory cells implemented with 6T SRAM.

According to one of the disclosed methods of generating an implementation of a circuit design on a programmable IC, first data are generated for implementing the circuit design. For example the circuit design may be compiled or also initially mapped and placed and routed. The designer may opt to make selected portions of the circuit design highly reliable and less susceptible to SEUs. A portion of a circuit design designated to be made highly reliable and less susceptible to SEUs may also be referred to as a "critical portion." The designer may specify the critical portion or a design tool may automatically determine critical portions of an input circuit design. For example, a critical portion of the design may be a portion that uses a large portion of the configuration memory cells of a programmable resource to configure the desired function of that programmable resource. For example, a large lookup table (LUT) used in the circuit design may be considered critical if most of the input pins are used by the design, because a large portion of the configuration memory cells would be used to implement the desired function. In contrast, a large LUT would not be considered critical if only a few of the input pins were used by the design, because only a small portion of the configuration memory cells would be used to implement the desired function, and many of the configuration memory cells would be unused. An upset of an unused configuration memory cell would not affect operation of the circuit. According to the method, second data are generated for programming configuration memory cells of the programmable IC to implement the circuit design. A first subset of the second data is assigned to program a first type of configuration memory cells to implement the critical portion of the circuit design on a first subset of programmable logic resources and a first subset of programmable interconnect resources of the programmable IC. A second subset of the second data is assigned to program a second type of configuration memory cells to implement the non-critical portion of the circuit design on a second subset of programmable logic resources and a second subset of programmable interconnect resources of the programmable IC. In an example implementation, the first type of configuration memory cells has greater immunity to SEUs than the second type of configuration memory cells. That is, the first type of configuration memory cells is less susceptible to SEUs and has a lower FIT rate than the second type of configuration memory cells. The second data are stored and may be later used to configure the programmable IC.

According to a second method of generating an implementation of a circuit design on a programmable IC, a programmed processor generates first data for implementing the circuit design and a critical portion of the circuit design is determined as described above. Second data are generated for programming configuration memory cells of the programmable IC to implement the circuit design. A first subset of the second data of the second method is assigned to program 6T configuration memory cells of the programmable IC to implement three or more instances of the critical portion of the circuit design on a first subset of programmable logic resources and a first subset of programmable interconnect resources of the programmable IC. A second subset of the second data is assigned to program 12T configuration memory cells of the programmable IC to implement a voting circuit on a second subset of programmable logic resources and a second subset of programmable interconnect resources of the programmable IC. The voting circuit is coupled to receive output signals from the three instances of the first portion of the circuit design. The second data are stored and may be later used to configure the programmable IC.

A programmable IC having a configuration memory with both 12T and 6T configuration memory cells is also disclosed. In the programmable IC, programmable interconnect resources and programmable logic resources are coupled to the configuration memory. Different subsets of the programmable interconnect resources are programmable by the 6T and the 12T configuration memory cells. Similarly, different subsets of the programmable logic resources are programmable by the 6T and the 12T configuration memory cells. The programmable IC also includes programmable input/output (I/O) resources that are coupled to the configuration memory.

Figure 1:
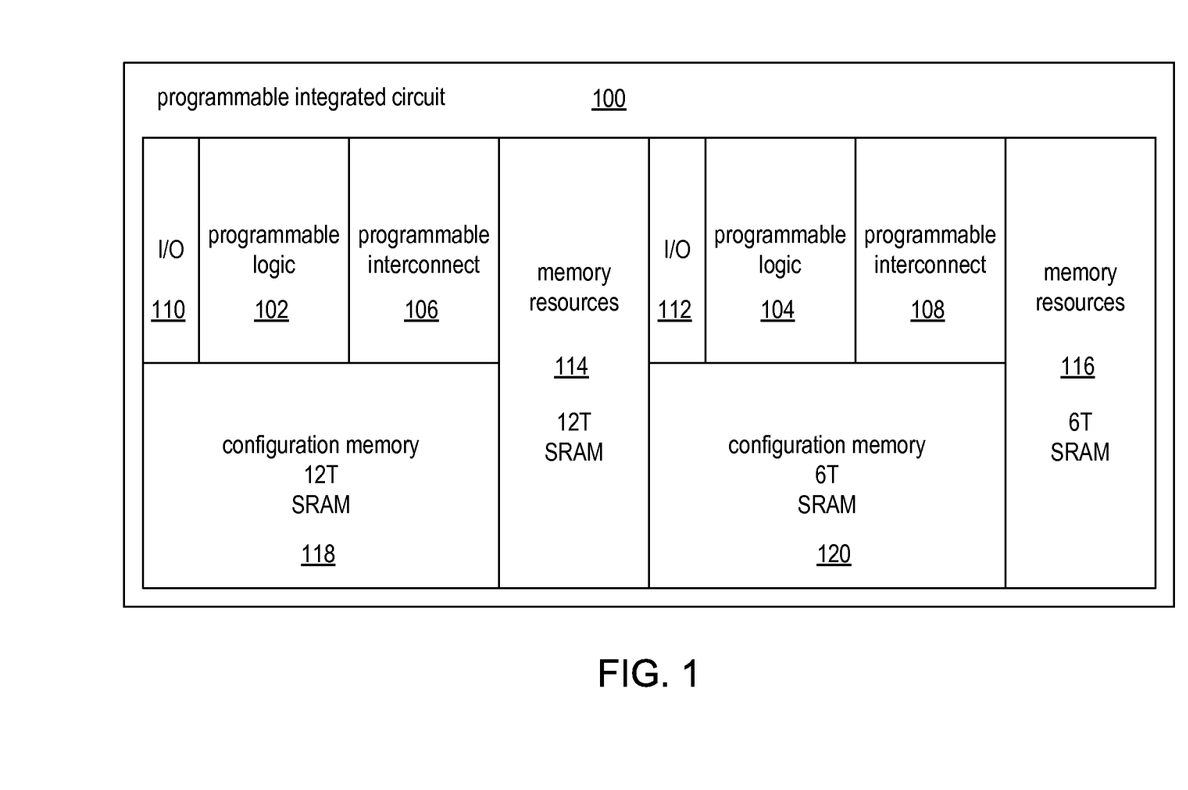
FIG. 1 shows a block diagram of a programmable integrated circuit (IC) having one portion of the programmable resources being configurable with 6T SRAM configuration memory and another portion of the programmable resources being configurable with 12T SRAM configuration memory.

FIG. 1 shows a block diagram of a programmable integrated circuit (IC) 100 having one portion of the programmable resources being configurable with 6T SRAM configuration memory and another portion of the programmable resources being configurable with 12T SRAM configuration memory. It will be recognized that FIG. 1 does not depict the physical layout of circuitry of the programmable IC. Rather, FIG. 1 shows that some programmable resources are configurable with 12T configuration memory cells and other programmable resources are configurable with 6T configuration memory cells. Also, programmable ICs may have types of programmable resources in addition to those that are illustrated.

The programmable resources of the programmable IC 100 include programmable logic resources 102 and 104, programmable interconnect resources 106 and 108, programmable input/output (I/O) resources 110 and 112, and memory resources 114 and 116. The programmable IC further includes configuration memory cells 118 and configuration memory cells 120. The configuration memory cells 118 are less susceptible to SEU upsets than are the configuration memory cells 120. In an example implementation, the configuration memory cells 118 are 12T memory cells, and the configuration memory cells 120 are 6T memory cells.

Different subsets of the programmable logic, programmable interconnect, and programmable I/O resources are programmable with the different types of configuration memory. For example, programmable logic resources 102 are programmable with configuration memory 118, which is implemented with 12T SRAM, and programmable logic resources 104 are programmable with configuration memory 120, which is implemented with 6T SRAM. Similarly, programmable interconnect resources 106 and programmable I/O resources 110 are programmable with configuration memory 118, and programmable interconnect resources 108 and programmable I/O resources 112 are programmable with configuration memory 120.

The programmable IC 100 further includes memory resources 114 and 116 that may be used for storage of application data by an application circuit implemented on the programmable logic resources 102 and 104, the programmable interconnect resources 106 and 108, and the programmable I/O resources 110 and 112. Memory resources 114 may be implemented with 12T SRAM, and memory resources 116 may be implemented with 6T SRAM. Data that are deemed to be critical to an application circuit implemented on the programmable IC 100 may be stored in memory resources 114 in order to reduce susceptibility to SEUs. Less critical data may be stored in memory resources 116.

The programmable IC 100 having some configuration memory that is less susceptible to SEU upsets than other configuration memory in the programmable IC provides flexibility in efforts to reduce the FIT rate for circuits implemented on the programmable IC. For example, critical portions of the circuit design may be implemented on programmable resources that are configurable by the configuration memory 118 implemented with 12T memory cells, and less critical portions of the circuit design may be implemented on programmable resources that are configurable by the configuration memory 120 implemented with 6T memory cells. Alternatively, a critical portion of the circuit design may be implemented as a TMR circuit on programmable resources that are configurable by the configuration memory 120 implemented with 6T memory cells, and a voting circuit may be implemented on programmable resources that are configurable by the configuration memory 118 implemented with 12T memory cells. In order to avoid the programmable IC from growing too large, there are fewer 12T configuration memory cells than 6T configuration memory cells. For example, 5-10% of the configuration memory cells may be 12T configuration memory cells, and the remaining configuration memory cells may be 6T cells.

Figure 2:
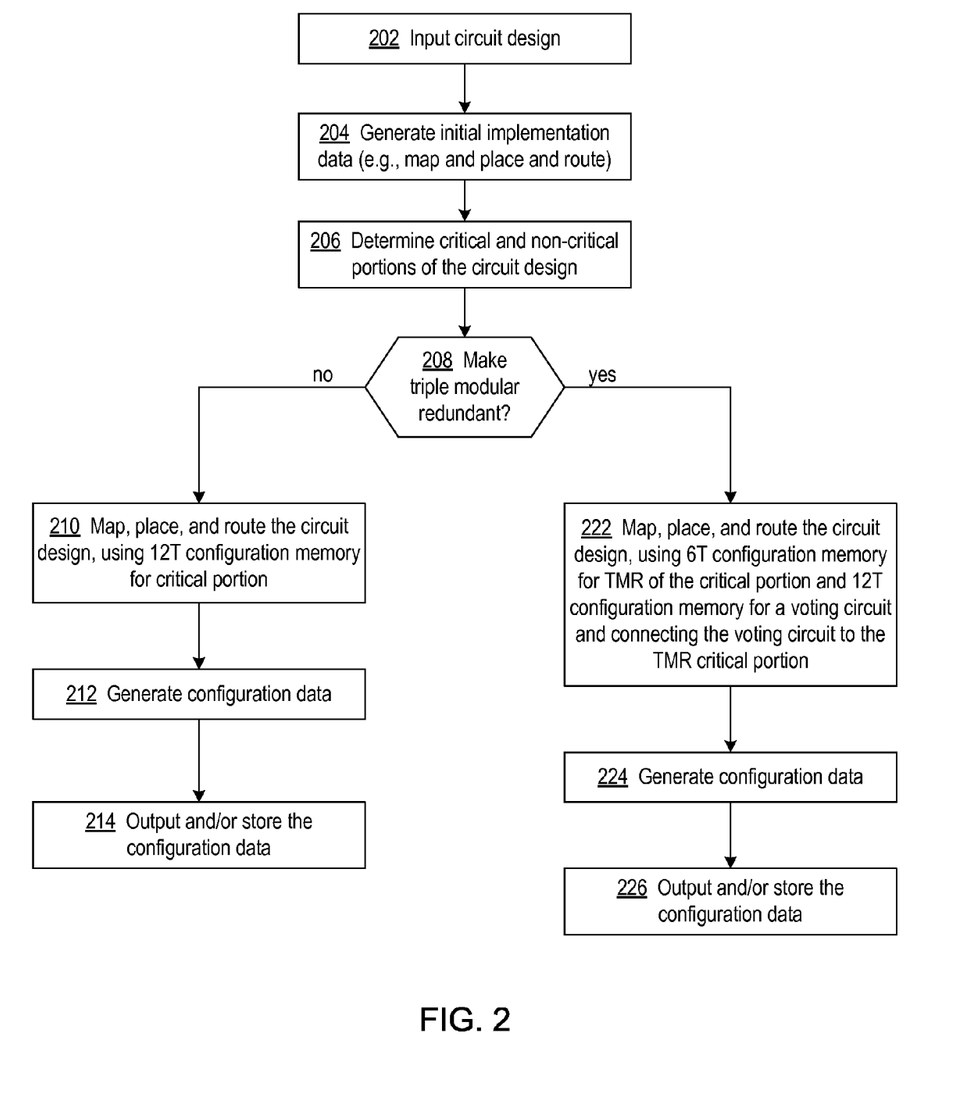
FIG. 2 shows a flowchart of a process for generating an implementation of a circuit design on a programmable IC having some configuration memory cells that are less susceptible to SEU upsets than other configuration memory cells of the programmable IC.

FIG. 2 shows a flowchart of a process for generating an implementation of a circuit design on a programmable IC having some configuration memory cells that are less susceptible to SEUs than other configuration memory cells of the programmable IC. A circuit design is input for processing at block 202, and at block 204, initial implementation data are generated. The initial implementation data may be the result of synthesizing the circuit design or further mapping and/or placing and routing the circuit design. Based on designer input, parts of the circuit design may be made highly reliable and less susceptible to SEU. The designer may designate particular portions of the circuit design that are to made highly reliable ("critical") or the critical portions may be automatically determined. At block 206, the process determines critical and non-critical portions of the circuit design.

In an automated procedure, a portion of a circuit design may be deemed to be critical if the FIT rate of the portion is a significant factor in the overall FIT rate of the implemented circuit design. For example, a large lookup table (LUT) used in the circuit design may be considered critical if most of the input pins are used by the design, because a large portion of the configuration memory cells would be used to implement the desired function. In contrast, a large LUT (a LUT having a large number of input pins) would not be considered critical if only a few of the input pins were used by the design, because only a small portion of the configuration memory cells would be used to implement the desired function, and many of the configuration memory cells would be unused. An upset of an unused configuration memory cell would not affect operation of the circuit. Similarly, a small LUT may be deemed to be non-critical since only a few configuration memory cells would be used to implement a function on that LUT. In an example implementation, a portion of a circuit design may be determined to be critical if the portion is implemented on a LUT having more than a threshold number of input pins and the number of input pins that are used is greater than a threshold. For example, a portion of the circuit design may be determined to be critical in response to the portion being implemented on a LUT having at least 6 input pins and at least 5 of the input pins are used. Further aspects of critical and non-critical portions of a circuit design are further described in co-pending patent application Ser. No. 14/266,547 by Jain et al. entitled "SELECTION OF LOGIC PATHS FOR REDUNDANCY," filed on Apr. 30, 2014, is incorporated herein by reference in its entirety.

At decision block 208, the process selects an approach for implementing the critical portion of the circuit design. The approach may be selected in response to designer input that specifies the desired approach. In a first approach, the critical portion is implemented using programmable resources that are programmed with 12T configuration memory cells, and in the second approach, the critical portion is implemented as a TMR circuit, with 12T configuration memory cells being used to implement the voting circuit.

In the first approach, at block 210, the circuit design is mapped, placed, and routed by assigning programmable resources that are programmed by 12T configuration memory cells to implement the critical portion. If the circuit design had previously been mapped, placed, and routed, the process may remap, replace, and reroute the circuit design accordingly.

At block 212, configuration data are generated for programming configuration memory cells of the programmable IC to implement the circuit design. A first subset of the configuration data programs the 12T configuration memory cells to implement the critical portion of the circuit design on a first subset of the programmable logic resources (as determined at block 210) and a first subset of the programmable interconnect resources (as determined at block 210) of the programmable IC. For example, the configuration data may be for programming parts of configuration memory 118 (FIG. 1), which is implemented with 12T memory cells, to implement the critical portions on the programmable logic resources 102 and programmable interconnect resources 106. The non-critical portion of the circuit design may be implemented on any of the available programmable resources of the programmable IC. For example, the non-critical portion of the circuit design may be implemented on a second subset of programmable logic resources (as determined at block 210) and a second subset of programmable interconnect resources (as determined at block 210) of the programmable IC, where the second subsets of resources are programmed with only 6T configuration memory cells or a combination of 6T and 12T configuration memory cells. The configuration data for implementing the non-critical portions may be for programming parts of configuration memory 120 (FIG. 1), which is implemented with 6T memory cells, to implement the non-critical portion on the programmable logic resources 104 and programmable interconnect resources 108.

The critical portion of the circuit design may further include memory resources that store data accessed by the circuit design. The generated configuration data may further include configuration data that programs programmable interconnect resources 106 and/or programmable interconnect resources 108 for connecting programmable logic resources 102 and/or programmable logic resources 104 to the memory resources 114, which are implemented by 12T memory cells.

The non-critical portion of the circuit design may further include memory resources that store non-critical data accessed by the circuit design. The generated configuration data may further include configuration data that programs programmable interconnect resources 106 and/or programmable interconnect resources 108 for connecting programmable logic resources 102 and/or programmable logic resources 104 to the memory resources 116, which are implemented by 6T memory cells.

At block 214, the configuration data generated at block 212 are output and/or stored in an electronically readable storage medium. The configuration data may be output and stored in a data storage device, such as a flash memory or magnetic storage device.

If a critical portion of the circuit design is to be implemented as a TMR circuit, decision block 208 directs the process to block 222. In an example approach, the critical portion of the circuit design is made TMR with programmable resources that are configurable with 6T configuration memory cells, and a voting circuit is implemented in programmable resources that are configurable with 12T configuration memory cells.

At block 222, the circuit design is mapped, placed, and routed by assigning programmable resources to implement three instances of the critical portion of the circuit design. The resources may be programmed by only 6T configuration memory cells or a combination of 6T and 12T configuration memory cells. If the circuit design had previously been mapped, placed, and routed, the process may remap, replace, and reroute the circuit design accordingly.

Programmable resources are also assigned at block 222 to implement a voting circuit and connect the voting circuit to the TMR circuit. The programmable resources that implement the voting circuit and that connect the voting circuit to the TMR circuit are programmed with only 12T configuration memory cells, which help protect the voting circuit against SEUs.

At block 224, configuration data are generated for programming the configuration memory cells that program the programmable resources that implement the TMR circuit and the voting circuit. The configuration data is specified for programming configuration memory cells that configure the functions of subsets of the programmable logic resources and programmable interconnect resources of the programmable IC as determined at block 222. For the TMR circuit, for example, the configuration data may be for programming parts of configuration memory 120 (FIG. 1), which is implemented with 6T memory cells, to implement the critical portion on portions of the programmable logic resources 104 and programmable interconnect resources 108. For the voting circuit, for example, the configuration data may be for programming parts of configuration memory 118 (FIG. 1), which is implemented with 12T memory cells, to implement the voting circuit on portions of the programmable logic resources 102 and programmable interconnect resources 106. The configuration data also configures the programmable resources to connect the voting circuit to receive output signals from the TMR circuit (e.g., FIG. 3, instances 302, 304, 306) that implements the critical portion of the circuit design.

At block 226, the configuration data generated at block 224 are output and/or stored in an electronically readable storage medium. The configuration data may be output and stored in a data storage device, such as a flash memory or magnetic storage device.

Figure 3:
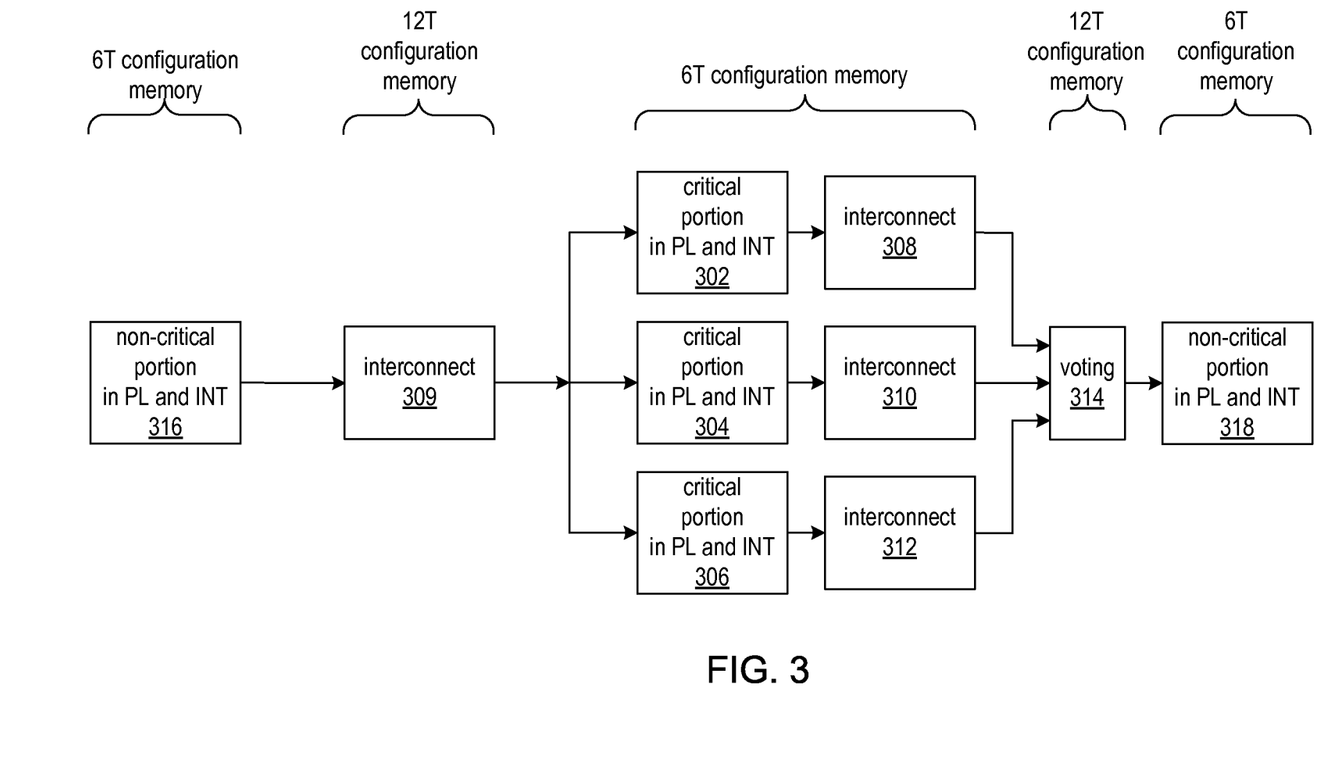
FIG. 3 shows a block diagram of a portion of a circuit design implemented as triple modular redundant (TMR) in programmable resources that are configurable with 6T configuration memory cells, along with a voting circuit that is implemented in programmable resources that are configurable with 12T configuration memory cells.

FIG. 3 shows a block diagram of a portion of a circuit design implemented as triple modular redundant (TMR) in programmable resources that are configurable with 6T configuration memory cells, along with a voting circuit that is implemented in programmable resources that are configurable with 12T configuration memory cells. Instead of implementing a critical portion of a circuit design on programmable resources that are configured with configuration memory having 12T memory cells, the critical portion may be implemented as a TMR circuit on programmable resources that are configured with configuration memory having 6T memory cells. The voting circuit may be implemented on programmable resources that are configured with configuration memory having 12T memory cells, which reduces susceptibility of the voting circuit to an SEU.

The critical portion of the circuit design is shown as being implemented as blocks 302, 304, 306, 308, 310, and 312. Blocks 302, 304, and 306 represent three instances of the critical portion of the circuit design implemented on respective programmable logic (PL) resources and programmable interconnect (INT) resources. Blocks 308, 310, and 312 represent interconnect resources that connect each instance of the critical portion to the voting circuit 314. The instances of the critical portion of the circuit design and the connections of the voting circuit may be implemented on programmable resources that are configurable with 6T configuration memory cells, because the circuitry is triplicated. The voting circuit may be implemented on programmable logic resources and programmable interconnect resources that are configurable with 12T configuration memory cells, which reduces susceptibility of the voting circuit to SEUs. The voting circuit 314 will output expected results as long as no more than one of the instances 302, 304, 306 and interconnect circuits 308, 310, and 312 has undergone an SEU.

The non-critical portions of the circuit design may be implemented on programmable logic resources and programmable interconnect resources that are configurable with 6T configuration memory cells. For example, non-critical portion 316 provides input to the TMR circuit (the critical portion), and non-critical portion 318 receives output from the critical portion via the voting circuit 314. Programmable interconnect resources 309 connect the non-critical portion 316 to the TMR instances 302, 304, and 306 of the critical portion, and the programmable interconnect resources 308 are configurable with 12T configuration memory cells.

Figure 4:
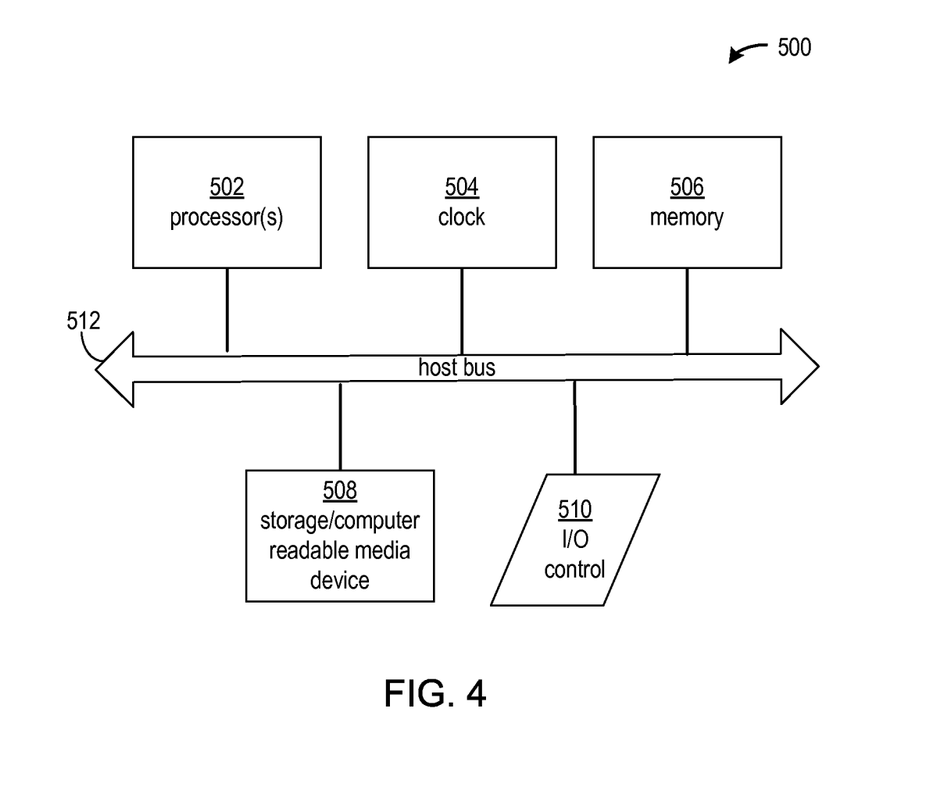
FIG. 4 shows an example of a computing arrangement that may be configured to implement the processes and data structures described herein.

FIG. 4 shows an example of a computing arrangement that may be configured to implement the processes and data structures described herein. Processor computing arrangement 500 includes one or more processors 502 that are programmed according to the executable computer code, a clock signal generator 504, a memory arrangement 506, a storage arrangement 508, and an input/output control unit 510, all coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory, and a main memory. The storage arrangement 508 may include local and/or remote persistent storage, such as provided by magnetic disks (not shown), flash, EPROM, or other non-volatile data storage. The storage unit may be read or read/write capable. Further, the memory arrangement 506 and storage arrangement 508 may be combined in a single arrangement.

The processor(s) 502 executes the software in storage arrangement 508 and/or memory arrangement 506, reads data from and stores data to the storage arrangement 508 and/or memory arrangement 506, and communicates with external devices through the input/output control arrangement 510. These functions are synchronized by the clock signal generator 504. The resource of the computing arrangement may be managed by either an operating system (not shown), or a hardware control unit (not shown).

Figure 5:
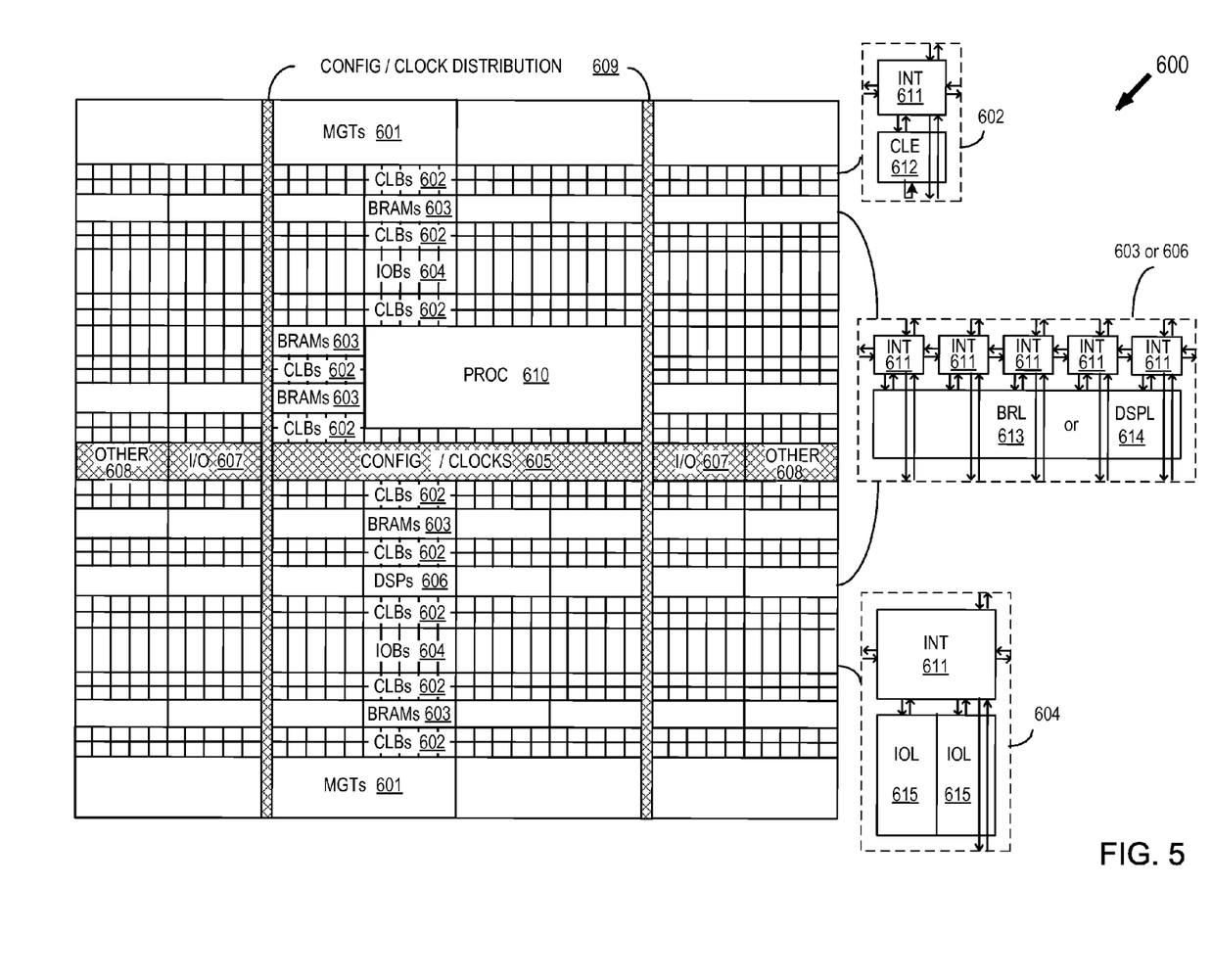
FIG. 5 shows a block diagram of an example programmable IC.

FIG. 5 shows a programmable integrated circuit (IC) 600 on which the disclosed circuits may be implemented. The programmable IC may also be referred to as a System On Chip (SOC) that includes field programmable gate array logic (FPGA) along with other programmable resources. FPGA logic may include several different types of programmable logic blocks in the array. For example, FIG. 5 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and internal and external reconfiguration ports (not shown).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 5.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

In the pictured embodiment, a columnar area near the center of the die (shown shaded in FIG. 5) is used for configuration, clock, and other control logic. Horizontal areas 609 extending from this column are used to distribute the clocks and configuration signals across the breadth of the programmable IC.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 610 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for processing a circuit design for protecting against SEUs. Other aspects and features will be apparent to those skilled in the art from consideration of the specification. It is intended that the specification and drawings be considered as examples only, with a true scope of the invention being indicated by the following claims.

What is claimed is:

1. A method of generating an implementation of a circuit design on a programmable integrated circuit (IC), comprising:
on a programmed processor, performing operations of:
inputting the circuit design;
generating first data for implementing the circuit design;
determining a critical portion and a non-critical portion of the circuit design, wherein the determining of the critical portion includes determining lookup tables (LUTs) having numbers of used inputs greater than a threshold;
generating second data for programming configuration memory cells of the programmable IC to implement the circuit design;
wherein a first subset of the second data is assigned to program a first type of configuration memory cells to implement the critical portion of the circuit design on a first subset of programmable logic resources and a first subset of programmable interconnect resources of the programmable IC;
wherein a second subset of the second data is assigned to program a second type of configuration memory cells to implement the non-critical portion of the circuit design on a second subset of programmable logic resources and a second subset of programmable interconnect resources of the programmable IC; and
storing the second data in an electronically readable storage medium.

2. The method of claim 1, wherein the first type of configuration memory cells have greater immunity to single event upsets (SEUs) than the second type of configuration memory cells.

3. The method of claim 1, wherein the first type of configuration memory cells are 12T memory cells and the second type of configuration memory cells are 6T memory cells.

4. The method of claim 1, wherein:
the first subset of the second data includes configuration data that connects the first subset of programmable logic resources to a first subset of memory resources of the programmable IC via the first subset of programmable interconnect resources for storage of data processed by the first subset of programmable logic resources; and the first subset of memory resources is implemented by 12T memory cells.

5. The method of claim 4, wherein:
the second subset of the second data includes configuration data that connects the second subset of programmable logic resources to a second subset of memory resources of the programmable IC via the second subset of programmable interconnect resources for storage of data processed by the second subset of programmable logic resources; and
the second subset of memory resources is implemented by 6T memory cells.

6. A method of generating an implementation of a circuit design on a programmable integrated circuit (IC), comprising:
on a programmed processor, performing operations of:
inputting the circuit design;
generating first data for implementing the circuit design;
determining a critical portion and a non-critical portion of the circuit design, wherein the determining of the critical portion includes determining lookup tables (LUTs) having numbers of used inputs greater than a threshold;
generating second data for programming configuration memory cells of the programmable IC to implement the circuit design;
wherein a first subset of the second data is assigned to program 6T configuration memory cells of the programmable IC to implement three or more instances of the critical portion of the circuit design on a first subset of programmable logic resources and a first subset of programmable interconnect resources of the programmable IC; and
wherein a second subset of the second data is assigned to program 12T configuration memory cells of the programmable IC to implement a voting circuit on a second subset of programmable logic resources and a second subset of programmable interconnect resources of the programmable IC, the voting circuit coupled to receive output signals from the three or more instances of the critical portion of the circuit design;
storing the second data in an electronically readable storage medium.

7. The method of claim 6, wherein the second data includes:
a third subset of the second data for programming 6T configuration memory cells of the programmable IC to implement the non-critical portion of the circuit design on a third subset of programmable logic resources and a third subset of programmable interconnect resources of the programmable IC.

8. The method of claim 1, further comprising:
selecting an approach from two different approaches for implementing the circuit design in response to user input;
wherein in response to user input specifying a first approach of the two different approaches, the first type of configuration memory cells are 12T memory cells and the second type of configuration memory cells are 6T memory cells.

9. The method of claim 8, further comprising:
in response to user input specifying a second approach of the two different approaches,
generating third data for programming configuration memory cells of the programmable IC to implement the circuit design;

wherein a first subset of the third data is assigned to program 6T configuration memory cells of the programmable IC to implement three or more instances of the critical portion of the circuit design on a third subset of programmable logic resources and a third subset of programmable interconnect resources of the programmable IC; and
wherein a second subset of the third data is assigned to program 12T configuration memory cells of the programmable IC to implement a voting circuit on a fourth subset of programmable logic resources and a fourth subset of programmable interconnect resources of the programmable IC, the voting circuit coupled to receive output signals from the three or more instances of the critical portion of the circuit design.

10. The method of claim 7, wherein the second subset of programmable interconnect resources of the programmable IC connect the third subset of programmable interconnect resources to the three or more instances of the critical portion of the circuit design on a first subset of programmable logic resources.

11. A system for generating an implementation of a circuit design on a programmable integrated circuit (IC), comprising:
one or more processors;
a memory arrangement coupled to the one or more processors, wherein the memory arrangement is configured with instructions that when executed by the one or more processors cause the one or more processors to perform operations including:
inputting the circuit design;
generating first data for implementing the circuit design;
determining a critical portion and a non-critical portion of the circuit design, wherein the determining of the critical portion includes determining lookup tables (LUTs) having numbers of used inputs greater than a threshold;
generating second data for programming configuration memory cells of the programmable IC to implement the circuit design;
wherein a first subset of the second data is assigned to program a first type of configuration memory cells to implement the critical portion of the circuit design on a first subset of programmable logic resources and a first subset of programmable interconnect resources of the programmable IC;
wherein a second subset of the second data is assigned to program a second type of configuration memory cells to implement the non-critical portion of the circuit design on a second subset of programmable logic resources and a second subset of programmable interconnect resources of the programmable IC; and
storing the second data in the memory arrangement.

12. The system of claim 11, wherein the first type of configuration memory cells have greater immunity to single event upsets (SEUs) than the second type of configuration memory cells.

13. The system of claim 11, wherein the first type of configuration memory cells are 12T memory cells and the second type of configuration memory cells are 6T memory cells.

14. The system of claim 11, wherein:
the first subset of the second data includes configuration data that connects the first subset of programmable logic resources to a first subset of memory resources of the programmable IC via the first subset of programmable interconnect resources for storage of data processed by the first subset of programmable logic resources; and the first subset of memory resources is implemented by 12T memory cells.

15. The system of claim 14, wherein:

the second subset of the second data includes configuration data that connects the second subset of programmable logic resources to a second subset of memory resources of the programmable IC via the second subset of programmable interconnect resources for storage of data processed by the second subset of programmable logic resources; and the second subset of memory resources is implemented by 6T memory cells.

* * * * *